United States Patent
Yang et al.

(10) Patent No.: US 10,500,959 B2
(45) Date of Patent: *Dec. 10, 2019

(54) SINGLE SUPPLY HYBRID DRIVE RESONANT GATE DRIVER

(71) Applicant: Ford Global Technologies, LLC, Dearborn, MI (US)

(72) Inventors: Shuitao Yang, Dearborn Heights, MI (US); Yan Zhou, Canton, MI (US); Lihua Chen, Farmington Hills, MI (US); Fan Xu, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 339 days.

This patent is subject to a terminal disclaimer.

(21) Appl. No.: 15/472,422

(22) Filed: Mar. 29, 2017

(65) Prior Publication Data

US 2018/0287601 A1  Oct. 4, 2018

(51) Int. Cl.
*B60L 1/00* (2006.01)
*H03K 17/04* (2006.01)
*H03K 17/041* (2006.01)
*H03K 17/567* (2006.01)
*B60L 50/16* (2019.01)
*B60L 58/10* (2019.01)
*H02M 1/00* (2006.01)

(52) U.S. Cl.
CPC .............. *B60L 1/003* (2013.01); *B60L 50/16* (2019.02); *B60L 58/10* (2019.02); *H03K 17/041* (2013.01); *H03K 17/0406* (2013.01); *H03K 17/567* (2013.01); *B60L 2210/10* (2013.01); *B60Y 2200/92* (2013.01); *B60Y 2300/91* (2013.01); *B60Y 2400/112* (2013.01); *H02M 2001/0054* (2013.01); *H03K 2217/0036* (2013.01); *Y02T 10/7005* (2013.01); *Y02T 10/7022* (2013.01); *Y02T 10/7077* (2013.01); *Y02T 10/7241* (2013.01); *Y02T 10/92* (2013.01); *Y02T 90/127* (2013.01); *Y10S 903/903* (2013.01)

(58) Field of Classification Search
CPC .......... B60L 1/003; B60L 50/16; B60L 58/10; H02J 50/12
See application file for complete search history.

(56) References Cited

U.S. PATENT DOCUMENTS

| | | | |
|---|---|---|---|
| 6,441,673 B1 | 8/2002 | Zhang | |
| 8,717,085 B2 | 5/2014 | Cioci | |
| 8,847,631 B2 | 9/2014 | Tao et al. | |
| 2013/0162322 A1* | 6/2013 | Tao | H03K 17/04123 327/381 |
| 2015/0138858 A1 | 5/2015 | Kusama et al. | |
| 2015/0188531 A1 | 7/2015 | Tang et al. | |

* cited by examiner

*Primary Examiner* — Daniel C Puentes
(74) *Attorney, Agent, or Firm* — David Kelley; Brooks Kushman P.C.

(57) ABSTRACT

A gate driver of a power device includes an inductor and a supply. The inductor is configured to, during a transitional period of the power device, convert a potential on a gate to a field, and the field to an opposite potential to toggle the gate and charge a floating capacitor to the opposite potential as an excess field collapses. The supply is configured to maintain the gate at the potential and generate the excess field during a non-transitional period.

17 Claims, 7 Drawing Sheets

SINGLE SUPPLY HYBRID DRIVE RESONANT GATE DRIVER

TECHNICAL FIELD

This application is generally related to a gate driver for a solid state switch in which a resonant circuit recirculates energy between an inductor and gate to reduce gate switching losses.

BACKGROUND

Electrified vehicles including hybrid-electric vehicles (HEVs), plugin hybrid electric vehicles (PHEVs), and battery electric vehicles (BEVs) rely on a traction battery to provide power to a traction motor for propulsion and a power inverter therebetween to convert direct current (DC) power to alternating current (AC) power. The typical AC traction motor is a 3-phase motor that may be powered by 3 sinusoidal signals each driven with 120 degrees' phase separation. The traction battery is configured to operate in a particular voltage range and provide a maximum current. The traction battery is alternatively referred to as a high-voltage battery. Improved performance of electric machines may be achieved by operating at a different voltage than the traction battery voltage, such as voltages greater than the traction battery voltage. Therefore, many electrified vehicles include a DC-DC converter, also referred to as a variable voltage converter (VVC), to convert the voltage of the traction battery to an operational voltage level of the electric machine. Due to the voltage, current and switching requirements, a solid state switch such as an Insulated Gate Bipolar Junction Transistor (IGBT) is typically used to generate the signals in the power inverter and the VVC.

SUMMARY

A gate driver of a power device includes an inductor and a supply. The inductor is configured to, during a transitional period of the power device, convert a potential on a gate to a field, and the field to an opposite potential to toggle the gate and charge a floating capacitor to the opposite potential as an excess field collapses. The supply is configured to maintain the gate at the potential and generate the excess field during a non-transitional period.

A method of recirculating a gate charge during transitioning of a power switch for a vehicle powertrain by a gate driver during turn-on includes inducing a field in an inductor via a negative charge on a gate of the power switch, converting the field to a positive charge, flowing the positive charge onto the gate and excess charge to a floating capacitor, and latching the positive charge onto the gate via the floating capacitor.

A gate driver of a power device includes a resonant circuit with an inductor. The resonant circuit is configured to recirculate charge during turn-off by inducing a first field based on a positive charge from a gate of the power device caused by a positive potential of a supply, and in response to reversal of a voltage across the inductor, collapsing the first field to draw charge from the gate and to a floating capacitor.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Generally, solid state devices (SSD), such as Insulated Gate Bipolar junction Transistors (IGBTs), Metal Oxide Semiconductor Field Effect Transistors (MOSFETs), or Bipolar Junction Transistors (BJTs) are widely used in a variety of automotive and industrial applications, such as electric motor drives, power inverters, DC-DC converters, and power modules. Operation of an IGBT and a MOSFET is voltage controlled, in which the operation is based on a voltage applied to a gate of the IGBT or MOSFET, while operation of a BJT is current controlled, in which the operation is based on a current applied to a base of the BJT. Here, the use of an IGBT will be discussed, however the structure and methods may be applicable to other SSDs, for example, an insulated gate SSD includes both an IGBT and a MOSFET. Operation of an IGBT is controlled by a gate voltage supplied by a gate driver. Conventional gate drivers are typically based on a voltage, greater than a threshold voltage, applied to the IGBT gate with a current limiting resistor, which typically consists of a switchable voltage source and a gate resistor. A low gate resistance would lead to a fast switching speed and low switching loss, but may also cause higher stresses on the semiconductor devices, e.g. over-voltage stresses. Therefore, the gate resistance is selected to seek a compromise between switching loss, switching delay, and stresses. When turning off an IGBT, the gate resistor reduces the current flowing from the gate and thereby increases a shutoff time of the IGBT. Also, the IGBT may not have equal losses during turn-on and turn-off, therefore the use of a gate driver that provides a turn-on resistance that is different from the turn-off resistance may be used.

When considering switching losses of circuit of an xEV such as an HEV, PHEV, or BEV, the power side transitions usually account for a majority of switching losses. The power side transitions include a turn-on transitions in which an IGBT transitions from an open-circuit to a conducting state between an emitter and collector of the IGBT or a turn-off transitions in which the IGBT transitions from a conducting state to an open-circuit between the emitter and collector of the IGBT. Here, a circuit is presented that reduces switching losses on the control side of a power switch via a resonant circuit that recirculates pull-down energy as pull-up energy during transitions between turn-off and turn-on. The circuit is configured to also recirculates pull-up energy as pull-down energy during transitions between turn-on and turn-off.

Figure 1:
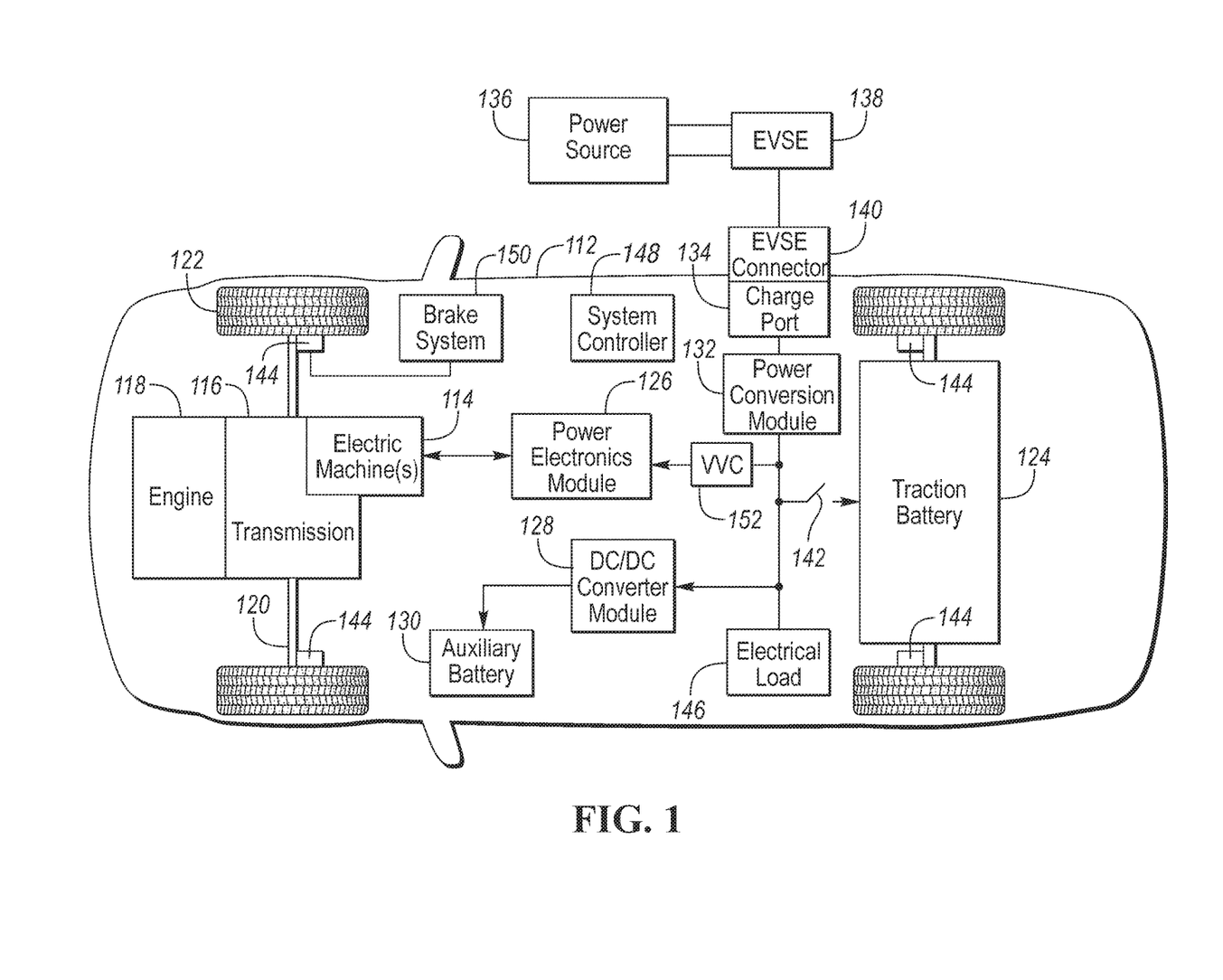
FIG. 1 is a diagram of a hybrid vehicle illustrating typical drivetrain and energy storage components with a variable voltage converter and power inverter therebetween.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and deceleration capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present. In other configurations, the electrified vehicle 112 may be a full hybrid-electric vehicle (FHEV) without plug-in capability.

A traction battery or battery pack 124 stores energy that can be used by the electric machines 114. The vehicle battery pack 124 may provide a high voltage direct current (DC) output. The traction battery 124 may be electrically coupled to one or more power electronics modules 126. One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) 152 electrically coupled between the traction battery 124 and the power electronics module 126. The VVC 152 may be a DC/DC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DC/DC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for decelerating the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for vehicle deceleration. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
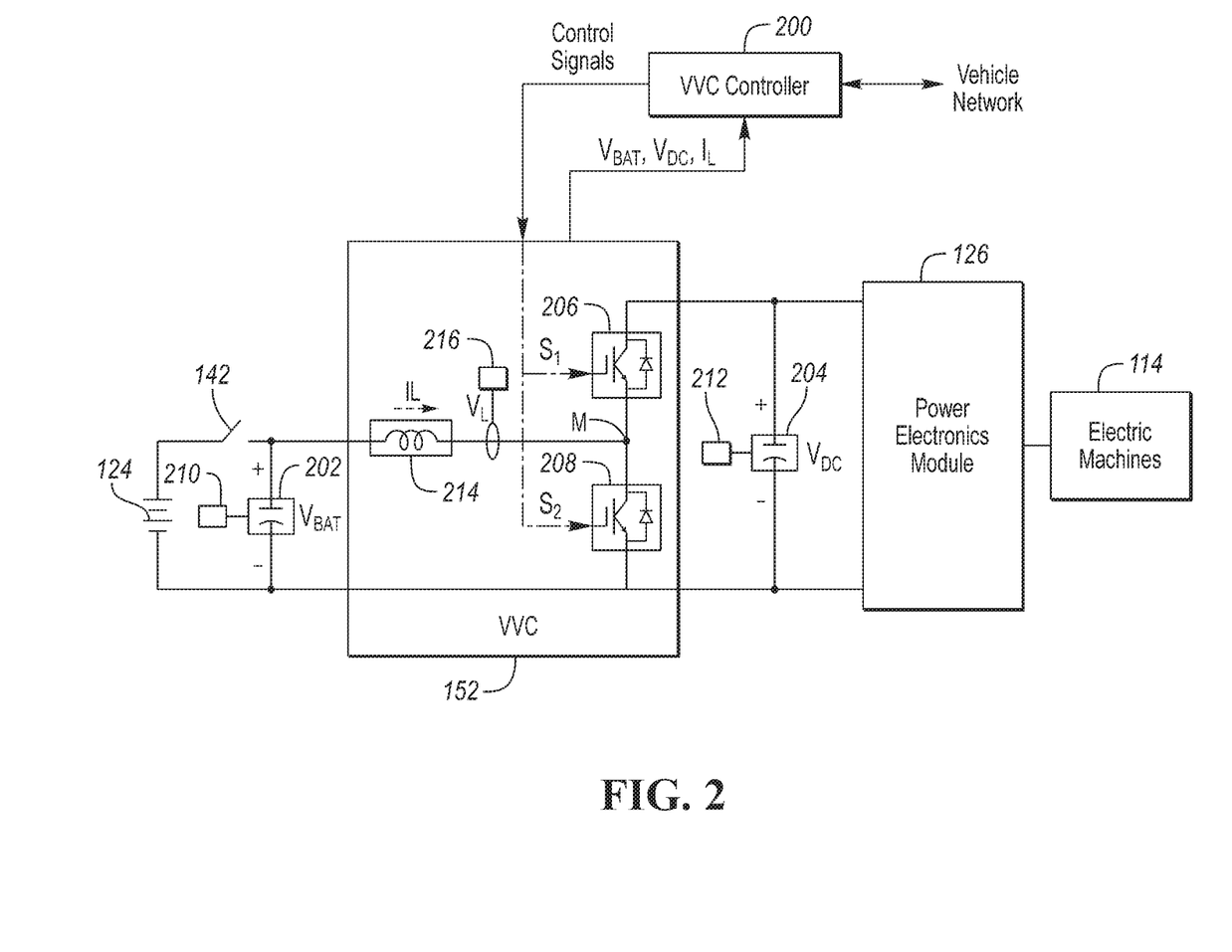
FIG. 2 is a schematic diagram of a vehicular variable voltage converter including a bypass diode.

FIG. 2 depicts a diagram of a VVC 152 that is configured as a boost converter. The VVC 152 may include input terminals that may be coupled to terminals of the traction battery 124 through the contactors 142. The VVC 152 may include output terminals coupled to terminals of the power electronics module 126. The VVC 152 may be operated to cause a voltage at the output terminals to be greater than a voltage at the input terminals. The vehicle 112 may include a VVC controller 200 that monitors and controls electrical parameters (e.g., voltage and current) at various locations within the VVC 152. In some configurations, the VVC controller 200 may be included as part of the VVC 152. The VVC controller 200 may determine an output voltage reference, $V_{dc}^*$. The VVC controller 200 may determine, based on the electrical parameters and the voltage reference, $V_{dc}^*$, a control signal sufficient to cause the VVC 152 to achieve the desired output voltage. In some configurations, the control signal may be implemented as a pulse-width modulated (PWM) signal in which a duty cycle of the PWM signal is varied. The control signal may be operated at a predetermined switching frequency. The VVC controller 200 may command the VVC 152 to provide the desired output voltage using the control signal. The particular control signal at which the VVC 152 is operated may be directly related to the amount of voltage boost to be provided by the VVC 152.

The output voltage of the VVC 152 may be controlled to achieve a desired reference voltage. In some configurations, the VVC 152 may be a boost converter. In a boost converter configuration in which the VVC controller 200 controls the duty cycle, the ideal relationship between the input voltage $V_{in}$ and the output voltage $V_{out}$ and the duty cycle D may be illustrated using the following equation:

$$V_{out} = \frac{V_{in}}{(1-D)} \quad (1)$$

The desired duty cycle, D, may be determined by measuring the input voltage (e.g., traction battery voltage) and setting the output voltage to the reference voltage. The VVC 152 may be a buck converter that reduces the voltage from input to output. In a buck configuration, a different expression relating the input and output voltage to the duty cycle may be derived. In some configurations, the VVC 152 may be a buck-boost converter that may increase or decrease the input voltage. The control strategy described herein is not limited to a particular variable voltage converter topology.

With reference to FIG. 2, the VVC 152 may boost or "step up" the voltage potential of the electrical power provided by the traction battery 124. The traction battery 124 may provide high voltage (HV) DC power. In some configurations, the traction battery 124 may provide a voltage between 150 and 400 Volts. The contactor 142 may be electrically coupled in series between the traction battery 124 and the VVC 152. When the contactor 142 is closed, the HV DC power may be transferred from the traction battery 124 to the VVC 152. An input capacitor 202 may be electrically coupled in parallel to the traction battery 124. The input capacitor 202 may stabilize the bus voltage and reduce any voltage and current ripple. The VVC 152 may receive the HV DC power and boost or "step up" the voltage potential of the input voltage according to the duty cycle.

An output capacitor 204 may be electrically coupled between the output terminals of the VVC 152. The output capacitor 204 may stabilize the bus voltage and reduce voltage and current ripple at the output of the VVC 152.

Further with reference to FIG. 2, the VVC 152 may include a first switching device 206 and a second switching device 208 for boosting an input voltage to provide the boosted output voltage. The switching devices 206, 208 may be configured to selectively flow a current to an electrical load (e.g., power electronics module 126 and electric machines 114). Each switching device 206, 208 may be individually controlled by a gate drive circuit (not shown) of the VVC controller 200 and may include any type of controllable switch (e.g., an insulated gate bipolar transistor (IGBT) or field-effect transistor (FET)). The gate drive circuit may provide electrical signals to each of the switching devices 206, 208 that are based on the control signal (e.g., duty cycle of PWM control signal). A diode may be coupled across each of the switching devices 206, 208. The switching devices 206, 208 may each have an associated switching loss. The switching losses are those power losses that occur during state changes of the switching device (e.g., on/off and off/on transitions). The switching losses may be quantified by the current flowing through and the voltage across the switching device 206, 208 during the transition. The switching devices may also have associated conduction losses that occur when the device is switched on.

The vehicle system may include sensors for measuring electrical parameters of the VVC 152. A first voltage sensor 210 may be configured to measure the input voltage, (e.g., voltage of the battery 124), and provide a corresponding input signal ($V_{bat}$) to the VVC controller 200. In one or more embodiments, the first voltage sensor 210 may measure the voltage across the input capacitor 202, which corresponds to the battery voltage. A second voltage sensor 212 may measure the output voltage of the VVC 152 and provide a corresponding input signal ($V_{dc}$) to the VVC controller 200. In one or more embodiments, the second voltage sensor 212 may measure the voltage across the output capacitor 204, which corresponds to the DC bus voltage. The first voltage sensor 210 and the second voltage sensor 212 may include circuitry to scale the voltages to a level appropriate for the VVC controller 200. The VVC controller 200 may include circuitry to filter and digitize the signals from the first voltage sensor 210 and the second voltage sensor 212.

An input inductor 214, often referred to as a boost inductor, may be electrically coupled in series between the traction battery 124 and the switching devices 206, 208. The input inductor 214 may alternate between storing and releasing energy in the VVC 152 to enable the providing of the variable voltages and currents as VVC 152 output, and the achieving of the desired voltage boost. A current sensor 216 may measure the input current through the input inductor 214 and provide a corresponding current signal ($I_L$) to the VVC controller 200. The input current through the input inductor 214 may be a result of the voltage difference between the input and the output voltage of the VVC 152, the conducting time of the switching devices 206, 208, and the inductance L of the input inductor 214. The VVC controller 200 may include circuitry to scale, filter, and digitize the signal from the current sensor 216.

The VVC controller 200 may be programmed to control the output voltage of the VVC 152. The VVC controller 200 may receive input from the VVC 152 and other controllers via the vehicle network, and determine the control signals. The VVC controller 200 may monitor the input signals ($V_{bat}$, $V_{dc}$, $I_L$, $V_{dc}*$) to determine the control signals. For example, the VVC controller 200 may provide control signals to the gate drive circuit that correspond to a duty cycle command. The gate drive circuit may then control each switching device 206, 208 based on the duty cycle command.

The control signals to the VVC 152 may be configured to drive the switching devices 206, 208 at a particular switching frequency. Within each cycle of the switching frequency, the switching devices 206, 208 may be operated at the specified duty cycle. The duty cycle defines the amount of time that the switching devices 206, 208 are in an on-state and an off-state. For example, a duty cycle of 100% may operate the switching devices 206, 208 in a continuous on-state with no turn off. A duty cycle of 0% may operate the switching devices 206, 208 in a continuous off-state with no turn on. A duty cycle of 50% may operate the switching devices 206, 208 in an on-state for half of the cycle and in an off-state for half of the cycle. The control signals for the two switches 206, 208 may be complementary. That is, the control signal sent to one of the switching devices (e.g., 206) may be an inverted version of the control signal sent to the other switching device (e.g., 208). The use of complementary control of the switching devices 206, 208 is desirable to avoid a shoot-through condition in which current flows directly through a high-side switching device 206 and a low-side switching device 208. The high-side switching device 206 is also called a pass device 206 and the low-side switching device 208 is also called a charging device 208.

Figure 5:
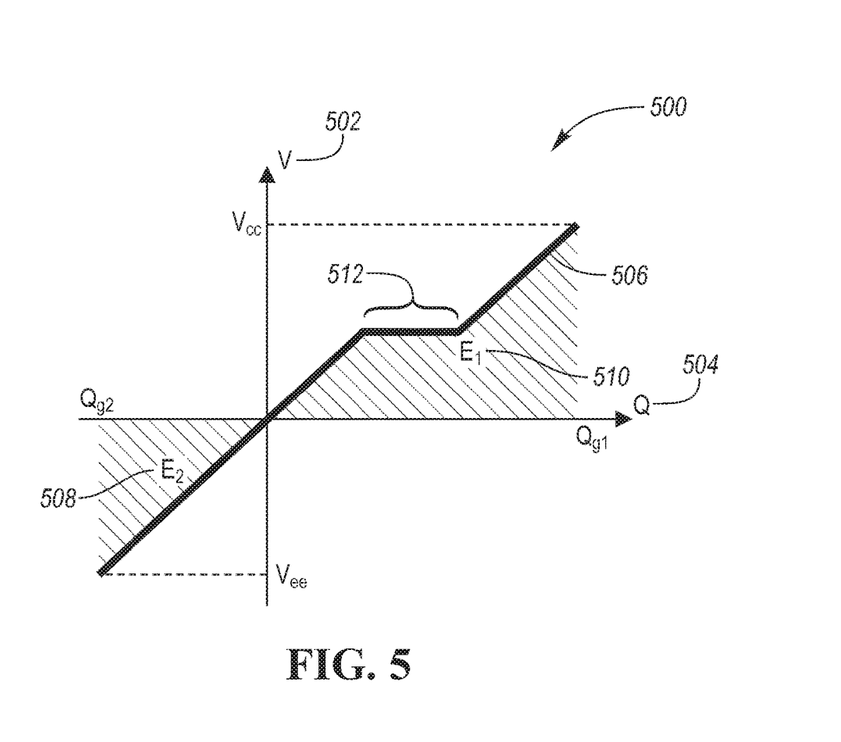
FIG. 5 is a graphical illustration of a voltage profile of a gate voltage with respect to charge during turn-on of an insulated gate bipolar junction transistor.

The current that is controlled by the switching devices 206, 208 may include a ripple component that has a magnitude that varies with a magnitude of the current, and the duty cycle and switching frequency of the switching devices 206, 208. Relative to the input current, the worst case ripple current magnitude occurs during relatively high input current conditions. When the duty cycle is fixed, an increase in the inductor current causes an increase in magnitude of the ripple current. The magnitude of the ripple current is also related to the duty cycle. The highest magnitude ripple current occurs when the duty cycle equals 50%. The general relationship between the inductor ripple current magnitude and the duty cycle may be as shown in FIG. 5. Based on these facts, it may be beneficial to implement measures to reduce the ripple current magnitude under high current and mid-range duty cycle conditions.

When designing the VVC 152, the switching frequency and the inductance value of the inductor 214 may be selected to satisfy a maximum allowable ripple current magnitude. The ripple component may be a periodic variation that appears on a DC signal. The ripple component may be defined by a ripple component magnitude and a ripple component frequency. The ripple component may have harmonics that are in an audible frequency range that may add to the noise signature of the vehicle. Further, the ripple component may cause difficulties with accurately controlling devices fed by the source. During switching transients, the switching devices 206, 208 may turn off at the maximum inductor current (DC current plus ripple current) which may cause large voltage spike across the switching devices 206, 208. Because of size and cost constraints, the inductance value may be selected based on the conducted current. In general, as current increases the inductance may decrease due to saturation.

The switching frequency may be selected to limit a magnitude of the ripple current component under worst case scenarios (e.g., highest input current and/or duty cycle close to 50% conditions). The switching frequency of the switching devices 206, 208 may be selected to be a frequency (e.g., 10 kHz) that is greater than a switching frequency of the motor/generator inverter (e.g., 5 kHz) that is coupled to an output of the VVC 152. In some applications, the switching frequency of the VVC 152 may be selected to be a predetermined fixed frequency. The predetermined fixed frequency is generally selected to satisfy noise and ripple current specifications. However, the choice of the predetermined fixed frequency may not provide best performance over all operating ranges of the VVC 152. The predetermined fixed frequency may provide best results at a particular set of operating conditions, but may be a compromise at other operating conditions.

Increasing the switching frequency may decrease the ripple current magnitude and lower voltage stress across the switching devices 206, 208, but may lead to higher switching losses. While the switching frequency may be selected for worst case ripple conditions, the VVC 152 may only operate under the worst case ripple conditions for a small percentage of the total operating time. This may lead to unnecessarily high switching losses that may lower fuel economy. In addition, the fixed switching frequency may concentrate the noise spectrum in a very narrow range. The increased noise density in this narrow range may result in noticeable noise, vibration, and harshness (NVH) issues.

The VVC controller 200 may be programmed to vary the switching frequency of the switching devices 206, 208 based on the duty cycle and the input current. The variation in switching frequency may improve fuel economy by reducing switching losses and reduce NVH issues while maintaining ripple current targets under worst case operating conditions.

During relatively high current conditions, the switching devices 206, 208 may experience increased voltage stress. At a maximum operating current of the VVC 152, it may be desired to select a relatively high switching frequency that reduces the ripple component magnitude with a reasonable level of switching losses. The switching frequency may be selected based on the input current magnitude such that as the input current magnitude increases, the switching frequency increases. The switching frequency may be increased up to a predetermined maximum switching frequency. The predetermined maximum switching frequency may be a level that provides a compromise between lower ripple component magnitudes and higher switching losses. The switching frequency may be changed in discrete steps or continuously over the operating current range.

The VVC controller 200 may be programmed to reduce the switching frequency in response to the current input being less than a predetermined maximum current. The predetermined maximum current may be a maximum operating current of the VVC 152. The change in the switching frequency may be based on the magnitude of the current input to the switching devices 206, 208. When the current is greater than the predetermined maximum current, the switching frequency may be set to a predetermined maximum switching frequency. As the current decreases, the magnitude of the ripple component decreases. By operating at lower switching frequencies as the current decreases, switching losses are reduced. The switching frequency may be varied based on the power input to the switching devices. As the input power is a function of the input current and the battery voltage, the input power and input current may be used in a similar manner.

Since the ripple current is also affected by the duty cycle, the switching frequency may be varied based on the duty cycle. The duty cycle may be determined based on a ratio of the input voltage to the output voltage. As such, the switching frequency may also be varied based on the ratio between the input voltage and the output voltage. When the duty cycle is near 50%, the predicted ripple current magnitude is a maximum value and the switching frequency may be set to the predetermined maximum frequency. The predetermined maximum frequency may be a maximum switching frequency value that is selected to minimize the ripple current magnitude. The switching frequency may be changed in discrete steps or continuously over the duty cycle range.

The VVC controller 200 may be programmed to reduce the switching frequency from the predetermined maximum frequency in response to a magnitude of a difference between the duty cycle and the duty cycle value (e.g, 50%) at which the predicted ripple component magnitude is a maximum. When the magnitude of the difference is less than a threshold, the switching frequency may be set to the predetermined frequency. When the magnitude of the difference decreases, the switching frequency may be increased toward the predetermined maximum frequency to reduce the ripple component magnitude. When the magnitude of the difference is less than a threshold, the switching frequency may be set to the predetermined maximum frequency.

The switching frequency may be limited to be between the predetermined maximum frequency and a predetermined minimum frequency. The predetermined minimum frequency may be a frequency level that is greater than a predetermined switching frequency of the power electronic module 126 that is coupled to an output of the variable voltage converter 152. The switching frequency may also be based on parasitic inductance associated with the gate of the IGBT.

Figure 3:
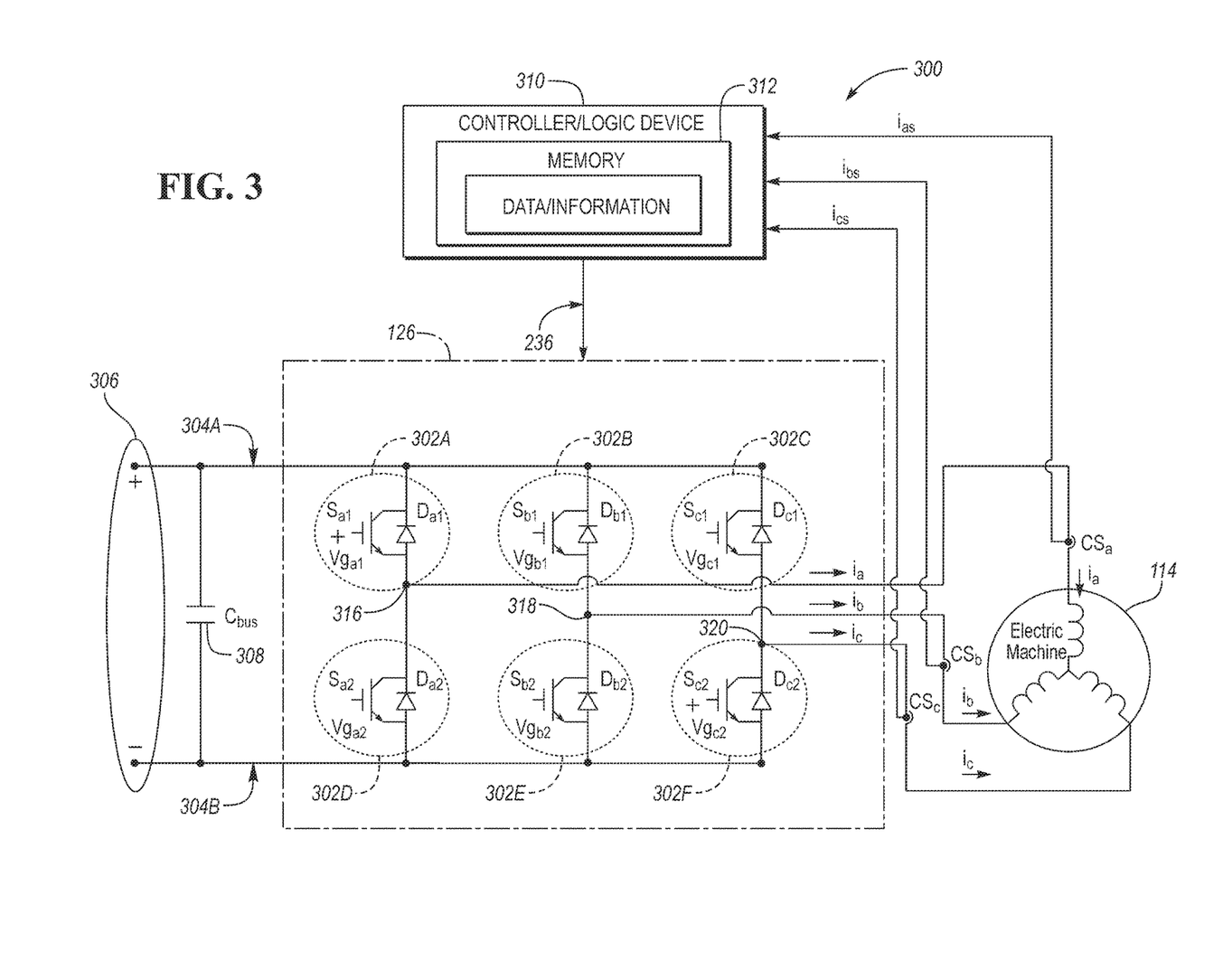
FIG. 3 is a schematic diagram of a vehicular electric machine inverter.

With reference to FIG. 3, a system 300 is provided for controlling a power electronics module (PEM) 126. The PEM 126 of FIG. 3 is shown to include a plurality of switches 302 (e.g., IGBTs) configured to collectively operate as an inverter with first, second, and third phase legs 316, 318, 320. While the inverter is shown as a three-phase converter, the inverter may include additional phase legs. For example, the inverter may be a four-phase converter, a five-phase converter, a six-phase converter, etc. In addition, the PEM 126 may include multiple converters with each inverter in the PEM 126 including three or more phase legs.

For example, the system 300 may control two or more inverters in the PEM 126. The PEM 126 may further include a DC to DC converter having high power switches (e.g., IGBTs) to convert a power electronics module input voltage to a power electronics module output voltage via boost, buck or a combination thereof.

As shown in FIG. 3, the inverter may be a DC-to-AC converter. In operation, the DC-to-AC converter receives DC power from a DC power link 306 through a DC bus 304 and converts the DC power to AC power. The AC power is transmitted via the phase currents ia, ib, and ic to drive an AC machine also referred to as an electric machine 114, such as a three-phase permanent-magnet synchronous motor (PMSM) as depicted in FIG. 3. In such an example, the DC power link 306 may include a DC storage battery to provide DC power to the DC bus 304. In another example, the inverter may operate as an AC-to-DC converter that converts AC power from the AC machine 114 (e.g., generator) to DC power, which the DC bus 304 can provide to the DC power link 306. Furthermore, the system 300 may control the PEM 126 in other power electronic topologies.

With continuing reference to FIG. 3, each of the phase legs 316, 318, 320 in the inverter includes power switches 302, which may be implemented by various types of controllable switches. In one embodiment, each power switch 302 may include a diode and a transistor, (e.g., an IGBT). The diodes of FIG. 3 are labeled $D_{a1}$, $D_{a2}$, $D_{b1}$, $D_{b2}$, $D_{c1}$, and $D_{c2}$ while the IGBTs of FIG. 3 are respectively labeled $S_{a1}$, $S_{a2}$, $S_{b1}$, $S_{b2}$, $S_{c1}$, and $S_{c2}$. The power switches $S_{a1}$, $S_{a2}$, $D_{a1}$, and $D_{a2}$ are part of phase leg A of the three-phase converter, which is labeled as the first phase leg A 316 in FIG. 3. Similarly, the power switches $S_{b1}$, $S_{b2}$, $D_{b1}$, and $D_{b2}$ are part of phase leg B 318 and the power switches $S_{c1}$, $S_{c2}$, $D_{c1}$, and $D_{c2}$ are part of phase leg C 320 of the three-phase converter. The inverter may include any number of the power switches 302 or circuit elements depending on the particular configuration of the inverter. The diodes ($D_{xx}$) are connected in parallel with the IGBTs ($S_{xx}$) however, as the polarities are reversed for proper operation, this configuration is often referred to as being connected anti-parallel. A diode in this anti-parallel configuration is also called a freewheeling diode.

As illustrated in FIG. 3, current sensors $CS_a$, $CS_b$, and $CS_c$ are provided to sense current flow in the respective phase legs 316, 318, 320. FIG. 3 shows the current sensors $CS_a$, $CS_b$, and $CS_c$ separate from the PEM 126. However, current sensors $CS_a$, $CS_b$, and $CS_c$ may be integrated as part of the PEM 126 depending on its configuration. Current sensors $CS_a$, $CS_b$, and $CS_c$ of FIG. 3 are installed in series with each of phase legs A, B and C (i.e., phase legs 316, 318, 320 in FIG. 3) and provide the respective feedback signals $i_{as}$, $i_{bs}$, and $i_{cs}$ (also illustrated in FIG. 3) for the system 300. The feedback signals $i_{as}$, $i_{bs}$, and $i_{cs}$ may be raw current signals processed by logic device (LD) 310 or may be embedded or encoded with data or information about the current flow through the respective phase legs 316, 318, 320. Also, the power switches 302 (e.g., IGBTs) may include current sensing capability. The current sensing capability may include being configured with a current mirror output, which may provide data/signals representative of $i_{as}$, $i_{bs}$, and $i_{cs}$. The data/signals may indicate a direction of current flow, a magnitude of current flow, or both the direction and magnitude of current flow through the respective phase legs A, B, and C.

Referring again to FIG. 3, the system 300 includes a logic device (LD) or controller 310. The controller or LD 310 can be implemented by various types or combinations of electronic devices and/or microprocessor-based computers or controllers. To implement a method of controlling the PEM 126, the controller 310 may execute a computer program or algorithm embedded or encoded with the method and stored in volatile and/or persistent memory 312. Alternatively, logic may be encoded in discrete logic, a microprocessor, a microcontroller, or a logic or gate array stored on one or more integrated circuit chips. As shown in the embodiment of FIG. 3, the controller 310 receives and processes the feedback signals $i_{as}$, $i_{bs}$, and $i_{cs}$ to control the phase currents $i_a$, $i_b$, and $i_c$ such that the phase currents $i_a$, $i_b$, and $i_c$ flow through the phase legs 316, 318, 320 and into the respective windings of the electric machine 114 according to various current or voltage patterns. For example, current patterns can include patterns of phase currents $i_a$, $i_b$, and $i_c$ flowing into and away from the DC-bus 304 or a DC-bus capacitor 308. The DC-bus capacitor 308 of FIG. 3 is shown separate from the PEM 126. However, the DC-bus capacitor 308 may be integrated as part of the PEM 126.

As shown in FIG. 3, a storage medium 312 (hereinafter "memory"), such as computer-readable memory may store the computer program or algorithm embedded or encoded with the method. In addition, the memory 312 may store data or information about the various operating conditions or components in the PEM 126. For example, the memory 312 may store data or information about current flow through the respective phase legs 316, 318, 320. The memory 312 can be part of the controller 310 as shown in FIG. 3. However, the memory 312 may be positioned in any suitable location accessible by the controller 310.

As illustrated in FIG. 3, the controller 310 transmits at least one control signal 236 to the power converter system 126. The power converter system 126 receives the control signal 322 to control the switching configuration of the inverter and therefore the current flow through the respective phase legs 316, 318, and 320. The switching configuration is a set of switching states of the power switches 302 in the inverter. In general, the switching configuration of the inverter determines how the inverter converts power between the DC power link 306 and the electric machine 114.

To control the switching configuration of the inverter, the inverter changes the switching state of each power switch 302 in the inverter to either an ON state or an OFF state based on the control signal 322. In the illustrated embodiment, to switch the power switch 302 to either ON or OFF states, the controller/LD 310 provides the gate voltage (Vg) to each power switch 302 and therefore drives the switching state of each power switch 302. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state and characteristics of the respective power switches 302. While the inverter is shown as a voltage-driven device in FIG. 3, the inverter may be a current-driven device or controlled by other strategies that switch the power switch 302 between ON and OFF states. The controller 310 may change the gate drive for each IGBT based on the rotational speed of the electric machine 114, the mirror current, or a temperature of the IGBT switch. The change in gate drive may be selected from a plurality of gate drive currents in which the change gate drive current is proportional to a change in IGBT switching speed.

As also shown in FIG. 3, each phase leg 316, 318, and 320 includes two switches 302. However, only one switch in each of the legs 316, 318, 320 can be in the ON state without shorting the DC power link 306. Thus, in each phase leg, the switching state of the lower switch is typically opposite the switching state of the corresponding upper switch. The top switches are typically referred to as high-side switches (i.e., 302A, 302B, 302C) and the lower switches are typically referred to as low-side switches (i.e., 302D, 302E, 302F). Consequently, a HIGH state of a phase leg refers to the upper switch in the leg in the ON state with the lower switch in the OFF state. Likewise, a LOW state of the phase leg refers to the upper switch in the leg in the OFF state with the lower switch in the ON state. As a result, IGBTs with current mirror capability may be on all IGBTs, a subset of IGBTs (e.g., $S_{a1}$, $S_{b1}$, $S_{c1}$) or a single IGBT.

Two situations can occur during an active state of the three-phase converter example illustrated in FIG. 3: (1) two phase legs are in the HIGH state while the third phase leg is in the LOW state, or (2) one phase leg is in the HIGH state while the other two phase legs are in the LOW state. Thus, one phase leg in the three-phase converter, which may be defined as the "reference" phase for a specific active state of the inverter, is in a state opposite to the other two phase legs, or "non-reference" phases, that have the same state. Consequently, the non-reference phases are either both in the HIGH state or both in the LOW state during an active state of the inverter.

Figure 4:
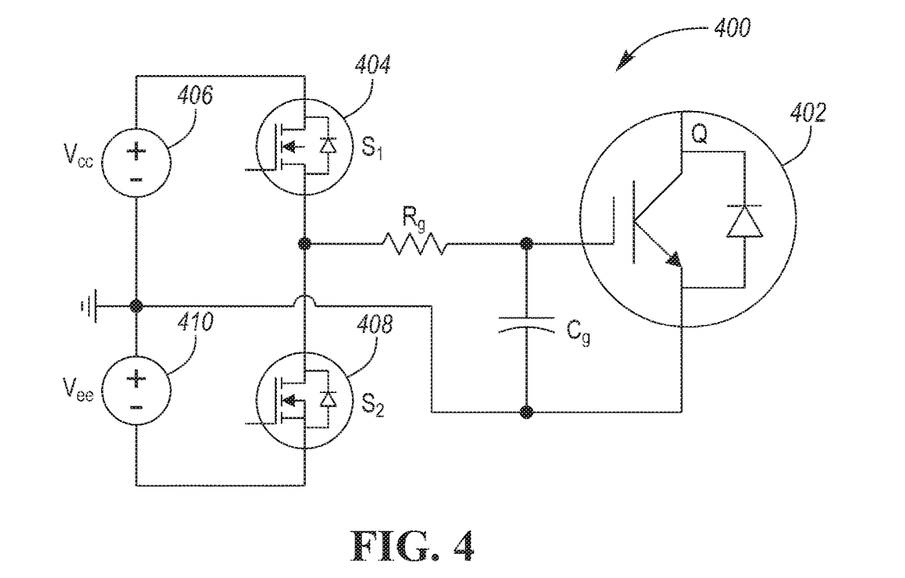
FIG. 4 is a schematic diagram of a typical insulated gate bipolar junction transistor gate drive circuit.

FIG. 4 is a schematic diagram of a typical insulated gate bipolar junction transistor gate drive circuit 400. This conventional half-bridge based gate-drive circuit may be used to control power flow to MOSFETs or IGBTs. An insulated gate bipolar junction transistor (IGBT) 402 is typically driven by a pull-up switch 404 that is supplied power via a pull-up supply 406 and a pull-down switch 408 that is supplied power via a pull-down supply 410. This gate drive circuit 400 is a popular gate-drive circuit that has been widely used for various industrial applications. An aspect of this circuit is that the gate-drive power supply needs to provide energy to charge/discharge the gate capacitor during the turn-on/turn-off process. And, the energy required to charge/discharge the gate capacitor during the turn-on/turn-off process is often dissipated in internal and external gate resistors. Here, a circuit is presented that reduces switching losses via a resonant circuit that recirculates pull-down energy as pull-up energy during transitions between turn-off and turn-on. The circuit is configured to also recirculates pull-up energy as pull-down energy during transitions between turn-on and turn-off.

FIG. 5 is a graphical illustration 500 of a voltage profile 506 of a gate voltage 502 with respect to a charge 504 during turn-on and turn-off of an insulated gate bipolar junction transistor. According to the gate-capacitor charge characteristics of MOSFET/IGBT, an equation to calculate power loss in the gate resistor $R_g$ of conventional gate-drive circuit is as follows in equation 2.

$$P_g = f_s \cdot (Q_{g1} + Q_{g2}) \cdot (V_{cc} + V_{ee}) \quad (2)$$

In which $f_s$ is a switching frequency of the switch, $Q_{g1}$ is the gate charge from zero to Vcc, $Q_{g2}$ is the gate charge from −Vee to zero. The gate-drive circuit power loss is directly proportional to the switching frequency and independent of the gate resistance. For power device with high-switching frequencies (e.g., SiC and GaN MOSFETs) which can switch up to hundreds of kHz to MHz, it is desirable to provide a high performance gate-drive circuit with extremely low power loss to improve system efficiency.

Figure 6:
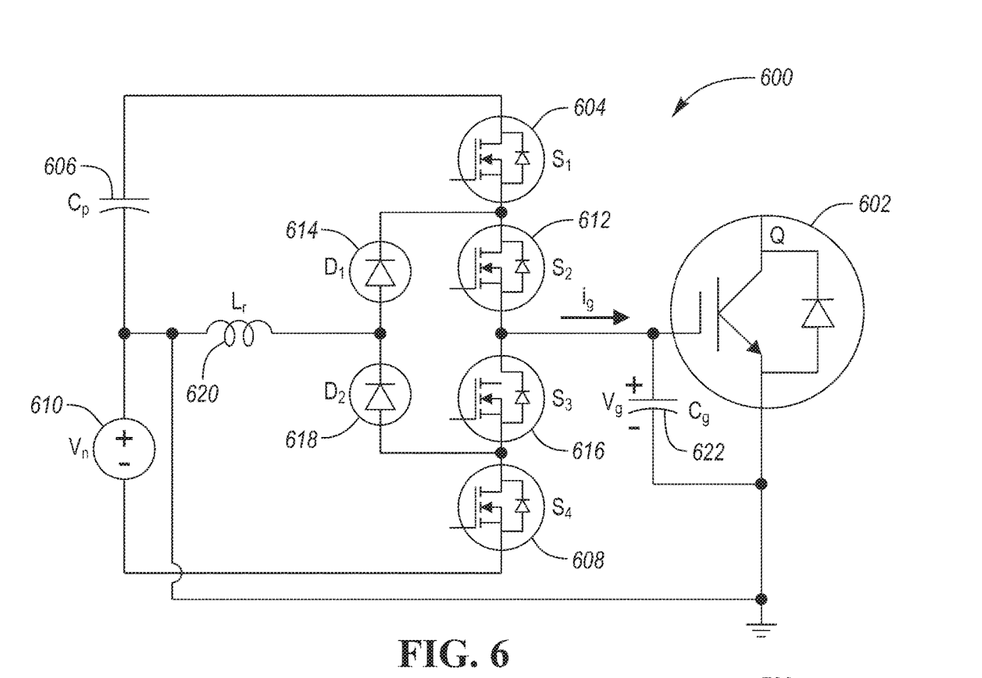
FIG. 6 is a schematic diagram of a resonant gate drive circuit for an insulated gate bipolar junction transistor having a single low-side power supply.

FIG. 6 is a schematic diagram of a resonant gate drive circuit 600 for an insulated gate bipolar junction transistor (IGBT) 602. Typically, a push-pull output driver includes a pull-up switch 604 supplied by a pull-up supply and a pull-down switch 608 supplied by a pull-down supply 610 (e.g., Vn). Here the pull-up supply is replaced with a pull-up capacitor Cp 606, thus eliminating the need for an additional power supply. Additional, resonant circuit components are added to reduce switching losses by recirculating the gate charge during switching transitions. A resonant pull-up switch 612 and resonant pull-up diode 614 (also referred to as recirculating diode 614) along with a resonant pull-down switch 616 and resonant pull-down diode 618 (also referred to as recirculating diode 618) along with a recirculating inductor 620 form a resonant circuit with the gate capacitance 622. In one embodiment, the pull-up capacitor Cp 606 is over 100 times greater than then gate capacitance 622 such that a voltage across the pull-up capacitor Cp 606 drops by only a few millivolts when applied to the gate capacitance 622. Here, the voltage of the negative supply 610 and an average of the voltage across the capacitor Cp 606 may have equal or different voltage amplitudes.

Figure 7:
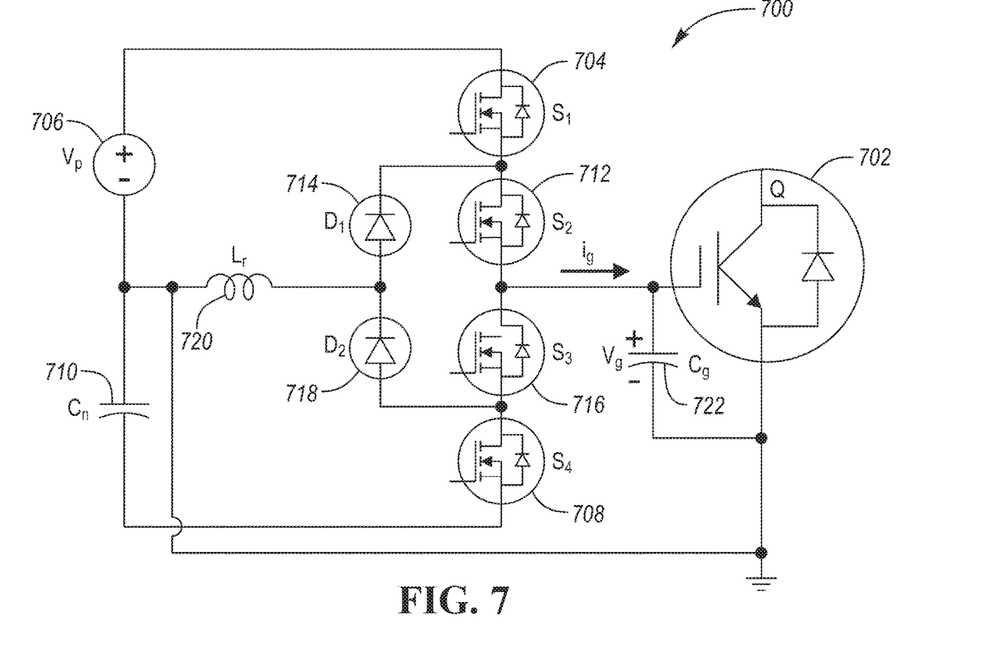
FIG. 7 is a schematic diagram of a resonant gate drive circuit for an insulated gate bipolar junction transistor having a single high-side power supply.

Similarly, FIG. 7 is a schematic diagram of a resonant gate drive circuit 700 for an insulated gate bipolar junction transistor (IGBT) 702. A push-pull output driver including a pull-up switch 704 supplied by a pull-up supply 706 (e.g., Vp) and a pull-down switch 708 supplied by a pull-down capacitor 710 (e.g., Cp) with additional resonant circuit components added to reduce switching losses by recirculating the gate charge during switching transitions. Replacing the pull-down supply with a pull-down capacitor Cn 710 eliminates the need for an additional power supply. The additional resonant circuit components include a resonant pull-up switch 712 and resonant pull-up diode 714 along with a resonant pull-down switch 716 and resonant pull-down diode 718 along with a recirculating inductor 720 to form the resonant circuit with the gate capacitance 722. In one embodiment, the pull-down capacitor Cn 610 is over 100 times greater than then gate capacitance 722 such that a voltage across the pull-down capacitor Cn 610 drops by only a few millivolts when applied to the gate capacitance 722. In FIGS. 6 and 7, N-MOSFETs are used for switches S1 to S4, however they may be replaced with P-MOSFETs or other solid state semiconductor devices, or a combination of N-MOSFETs and P-MOSFETs may be used, for example, P-MOSFETs may be used to pull up the gate, and N-MOSFETs may be used to pull down the gate. Here, the voltage of the positive supply 706 and an average of the voltage across the negative capacitor Cn 710 may have equal or different voltage amplitudes.

Figure 8:
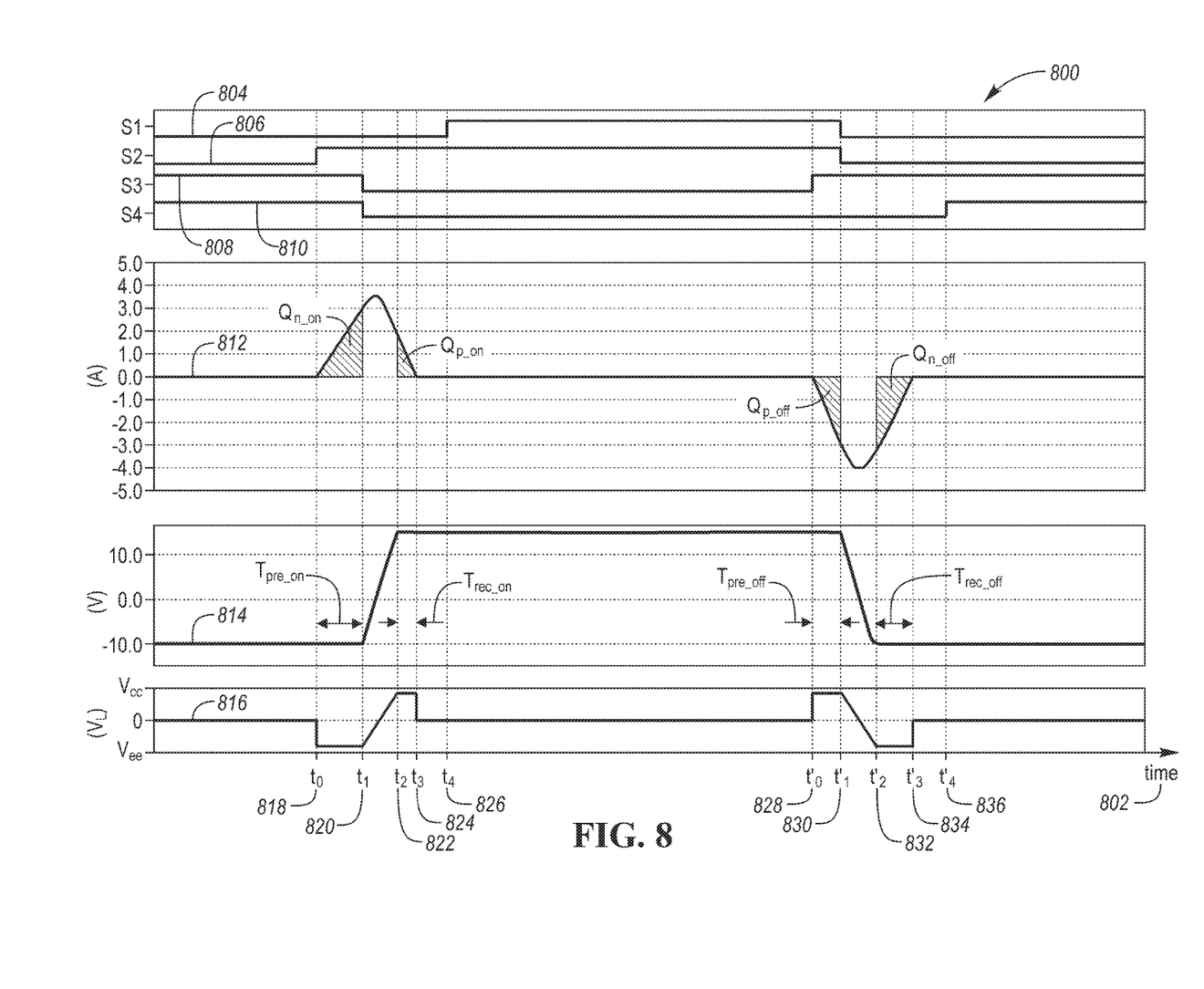
FIG. 8 is a graphical diagram of operating characteristics of a resonant gate drive circuit for a power device with respect to time.

FIG. 8 is a graphical diagram 800 of operating characteristics of a resonant gate drive circuit (e.g., the gate drive circuit of FIGS. 6 and 7) for a power device with respect to time 802. The proposed resonant gate-drive circuits (e.g., FIGS. 6 and 7) for MOSFETs/IGBTs are shown with two different configurations. However, both configurations only need a single power supply to generate an output bipolar gate voltage, i.e. +Vp, −Vn. As the two circuit configurations in FIGS. 6 and 7 have similar operating principle, the illustration of FIG. 8 details the operation principles of circuit in FIG. 6 that will be explained for simplicity.

Here, the operating characteristics include an input voltage profile of control signals including, a pull-up switch gate voltage profile 804 (e.g., associated with element 604 or 704 of the gate drive circuit of FIG. 6 or 7, respectively), a resonant pull-up switch gate voltage profile 806 (e.g., associated with element 612 or 712 of the gate drive circuit of FIG. 6 or 7, respectively), a resonant pull-down switch gate voltage profile 808 (e.g., associated with element 616 or 716 of the gate drive circuit of FIG. 6 or 7, respectively), and a pull-down switch gate voltage profile 810 (e.g., associated with element 608 or 708 of the gate drive circuit of FIG. 6 or 7, respectively), along with a resonant inductor (Lr) current profile 812 (e.g., associated with the resonant inductor Lr 620 or 720 of FIG. 6 or 7, respectively), a gate voltage profile 814 (e.g., associated with a voltage across element 622 or 722 of the gate drive circuit of FIG. 6 or 7, respectively), and an inductor voltage profile 816 (e.g., associated with element 620 or 720 of the gate drive circuit of FIG. 6 or 7, respectively). In this graphical diagram 800, a processing device, controller, control logic, or similar structure may be used drive and transition the inputs of switches S1-S4 (e.g., 604, 608, 612, 616, 704, 708, 712, and 716).

This graphical diagram starts at a time, prior to time t0 818, at which switches S3 (e.g., 616, 716) and S4 (e.g., 608, 708) are both on to clamp the gate voltage to −Vn, that in the embodiment of FIG. 6 is the voltage of the negative supply Vn 610 and in the embodiment of FIG. 7 which is the voltage of floating capacitor Cn 710. Prior to time t0, the power device Q (e.g., 602, 702) is off.

At time t0 818, switch S2 (e.g., 612, 712) is turned on, while switches S3 (e.g., 616, 716) and S4 (e.g., 608, 708) are both on. When switch S2 (e.g., 612, 712) is turned on, a resonant inductor Lr (e.g., 620, 720) is pre-charged by floating capacitor Cn 710 in the embodiment of FIG. 7 and is pre-charged by negative supply 610 in the embodiment of FIG. 6. The time duration between t0 (818) and t1 (820) is a turn-on pre-charge period Tpre-on, which is equal to t1−t0. During the turn-on pre-charge period, the voltage of the gate (e.g., 622, 722) is clamped to −Vn.

At time t1 820, switches S3 (e.g., 616, 716) and S4 (e.g., 608, 708) are turned off while switch S2 (e.g., 612, 712) remains on. As switch S2 (e.g., 612, 712) is on, the gate capacitor Cg (e.g., 622, 722) is coupled in parallel with Lr (e.g., 620, 720) through D1 (e.g., 614, and 714) and S2 (e.g., 612, 712). This creates an LC resonance circuit between Cg (e.g., 622, 722) and Lr (e.g., 620, 720) that will flow an electric charge to the gate such that a gate voltage Vg increases from −Vn to +Vp, and the power device Q (e.g., 602, 702) is turned on.

After the voltage of the gate Vg is charged to the voltage across the positive capacitor Cp 606 (VCp) or the positive supply +Vp 706, an anti-parallel diode of switch S1 (e.g., 604, 704) becomes forward biased and clamps the gate voltage Vg. After the gate voltage Vg is clamped to +Vp or VCp, excessive current in the inductor Lr (e.g., 620, 720) will flow back to the positive power supply of Vp 706 or the positive capacitor Cp 606. The time duration between t2 822 and t3 824 is a turn-on on energy recovery period Trec-on, which is equal to t3 (824)−t2 (822). In the embodiment of FIG. 6, the excess current in the inductor Lr 620 will flow back to the positive terminal of the positive capacitor Cp 606 and will recharge the capacitor Cp 606 to maintain operation.

During the time between t3 824 and t4 826, diode D1 (e.g., 614, 714) is turned off when the current in inductor Lr (e.g., 620, 720) becomes zero. When the current in the inductor Lr (e.g., 620, 720) becomes zero, the energy from the field of the inductor Lr (e.g., 620, 720) ceases to be recovered by the positive power supply Vp 706 as shown in FIG. 7, or the positive capacitor Cp 606 as shown by FIG. 6.

At t4 826, switch S1 (e.g., 604, 704) is turned on and after t4 826 as both switches S1 (e.g., 604, 704) and S2 (e.g., 612, 712) are both on, the voltage of the gate will be clamped to +Vp or VCp. A transitional period of the power device during turn-on is a time from T0 818 to T4 826.

At time t'0 828, switch S3 (e.g., 616, 716) is turned on, while switches S1 (e.g., 604, 704) and S2 (e.g., 612, 712) are both on. When switch S3 (e.g., 616, 716) is turned on, a resonant inductor Lr (e.g., 620, 720) is pre-charged by floating capacitor Cp 606 in the embodiment of FIG. 6 and is pre-charged by positive supply 706 in the embodiment of FIG. 7. The time duration between t'0 (828) and t'1 (830) is a turn-off pre-charge period Tpre-off, which is equal to t'1–t'0. During the turn-off pre-charge period, the voltage of the gate (e.g., 622, 722) is clamped to +Vp.

At time t'1 830, switches S1 (e.g., 604, 704) and S2 (e.g., 612, 712) are turned off while switch S3 (e.g., 616, 716) remains on. As switch S3 (e.g., 616, 716) is on, the gate capacitor Cg (e.g., 622, 722) is coupled in parallel with Lr (e.g., 620, 720) through D2 (e.g., 618, and 718) and S3 (e.g., 616, 716). This creates an LC resonance circuit between Cg (e.g., 622, 722) and Lr (e.g., 620, 720) that will flow an electric charge from the gate such that the gate voltage Vg decreases from +Vp to −Vn, and the power device Q (e.g., 602, 702) is turned off.

After the voltage of the gate Vg is depleted to the voltage across the negative capacitor Cn 710 (VCn) or the negative supply −Vn 610, an anti-parallel diode of switch S4 (e.g., 608, 708) becomes forward biased and clamps the gate voltage Vg. After the gate voltage Vg is clamped to −Vn or VCn, excessive current in the inductor Lr (e.g., 620, 720) will flow back to the negative power supply of Vn 610 or the negative capacitor Cn 610. The time duration between t'2 832 and t'3 834 is a turn-off off energy recovery period Trec-off, which is equal to t'3 (834)–t'2 (832). In the embodiment of FIG. 7, the excess current in the inductor Lr 720 will flow back to the positive terminal of the negative capacitor Cn 710 and will recharge the capacitor Cn 710 to maintain operation.

During the time between t'3 834 and t'4 836, diode D2 (e.g., 618, 718) is turned off when the current in inductor Lr (e.g., 620, 720) becomes zero. When the current in the inductor Lr (e.g., 620, 720) becomes zero, the energy from the field of the inductor Lr (e.g., 620, 720) ceases to be recovered by the negative power supply Vn 610 as shown in FIG. 6, or the negative capacitor Cn 710 as shown by FIG. 7.

At t'4 836, switch S4 (e.g., 608, 708) is turned on and after t'4 836 as both switches S3 (e.g., 616, 716) and S4 (e.g., 608, 708) are both on, the voltage of the gate will be clamped to −Vn or VCn. A transitional period of the power device during turn-off is a time from T'0 828 to T'4 836.

Figure 9:
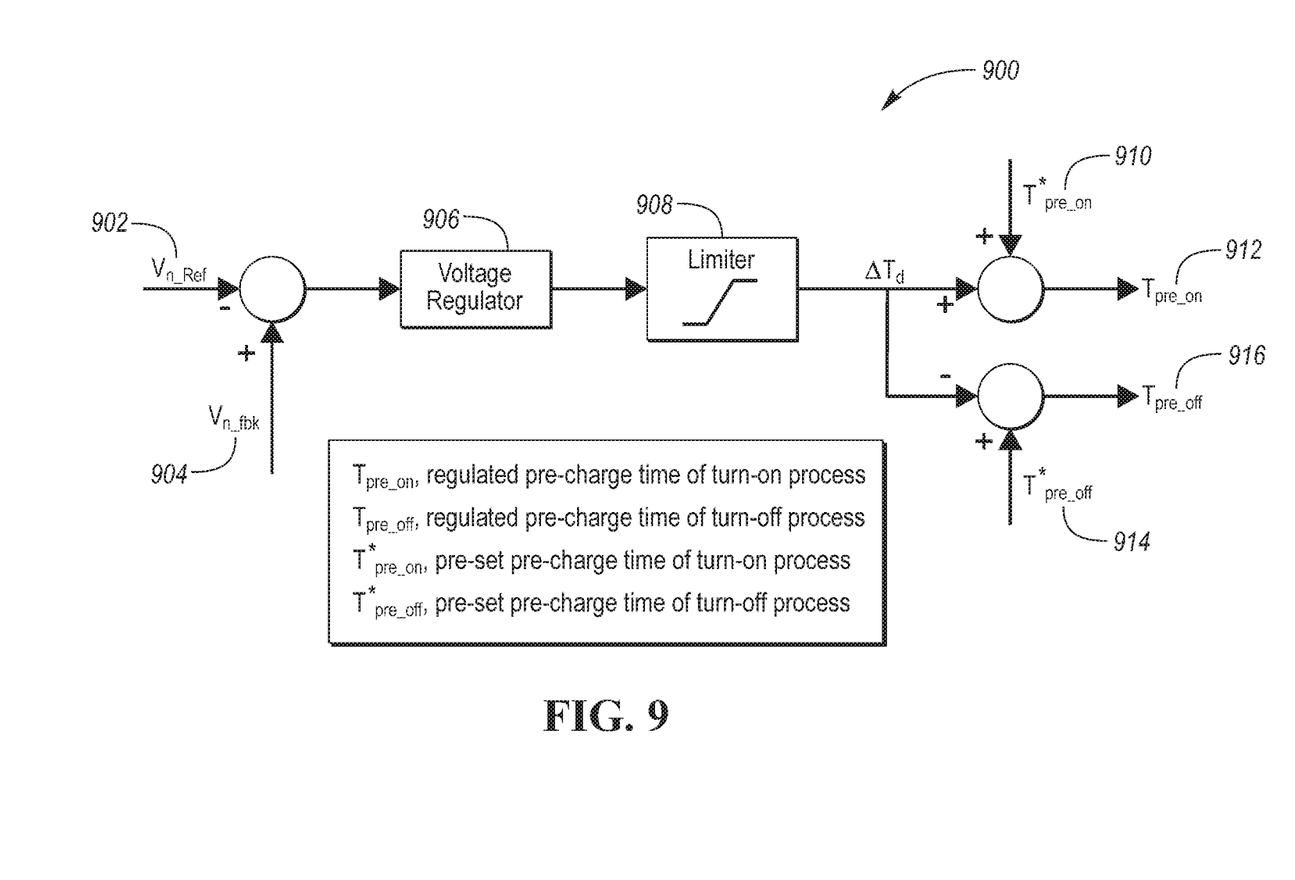
FIG. 9 is a flow diagram for a voltage balanced control system for a floating capacitor.

FIG. 9 is a flow diagram for a voltage balanced control system 900 for a floating capacitor. Consider the floating capacitor Cp 606/Cn 710 as in the resonant gate-drive circuits 600, 700 of FIGS. 6 and 7. These circuits 600, 700 allow the use of a single power supply to be used while recirculating charge of gate. One key aspect of this system is the control of the balance of voltages for the floating capacitors 606, 710. This voltage balanced control system 900 for a floating capacitor is for a negative floating capacitor such as Cn 710 of FIG. 7, but the principles are applicable to a positive floating capacitor such as Cp 606 of FIG. 6. Here, a target reference voltage Vn_ref 902 combines with a negative capacitor feedback voltage Vn_fbk. The output is then forwarded to a voltage regulator 906 that outputs a times or duty cycles associated with operation of the switches of gate control circuit (e.g., 604, 612, 616, 608, 704, 712, 716, and 708) the operational times or duty cycles are then limited by a limiter 908 such that the time difference ΔTd is generated and used to offset the target pre-charge on time during the turn-on T*pre_on 910 to output a regulated pre-charge time during the turn-on Tpre_on 912, and to offset the target pre-charge off time during the turn-off T*pre_off 914 to output a regulated pre-charge time during the turn-off Tpre_off 916.

As the circuits of FIGS. 6 and 7 have similar operation principles, the principles of one of these circuits may be used to describe the principles of the other. Considering FIG. 8 to illustrate electrical characteristics associated with operation of the circuits of FIG. 7. The electric charge for the positive power supply 706 and the negative voltage across the negative floating capacitor 710 during turn-on (e.g., t0 818–t4 826) and turn-off (e.g., t'0 828–t'4 836) may be evaluated during the four charge recirculation or recapture phases, that are Qn_on, Qp_on, Qp_off, and Qn_off.

For reference, the charge is defined according to the inductor current, (i.e., a positive direction of charge is the charge flowing out of a negative power supply or negative capacitor; while for a positive power supply/capacitor, a positive direction is the charge flowing into power supply/capacitor).

First, Qn_on, as illustrated in FIG. 8, is the electric charge flowing out of the negative power supply during Tpre_on of the turn-on process, in which Tpre_on is during the time or period (t1 820–t0 818) and negative power supply is the floating capacitor Cn 710 as shown in FIG. 7.

Next, Qp_on, as illustrated in FIG. 8, is the electric charge flowing into the positive power supply during Trec_on of turn-on process, where Trec_on=t3 824–t2 822, and positive power supply indicates the power supple Vp 706 as shown in FIG. 7. Here, excess charge after the gate is at a level, Vp, flows through the upper diode 714 and the body diode of switch S1 704 to the positive power supply. Considering this operation with FIG. 6, and the excess energy from the collapse of the field of the inductor Lr 620 flows through diode D1 614 and the body diode of switch S1 604 to charge the positive floating capacitor Cp 606, thereby increasing the voltage of the positive floating capacitor Cp 606. Qp_on is an energy recovery charge.

Qp_off is the electric charge into the positive power supply during Tpre_off of turn-off process, where Tpre_off=t'1 830–t'0 828, and positive power supply indicates the power supple Vp 706 as shown in FIG. 7.

Qn_off is the electric charge out of negative power supply during Trec off of turn-off process, where Trec off=t'3 834–t'2 832, and negative power supply indicates floating capacitor Cn 710 as shown in FIG. 7. The excess energy from the collapse of the field of the inductor Lr 720 flows through diode D2 718 and the body diode of switch S4 708 to charge the negative floating capacitor Cn 710, thereby increasing the voltage of the negative floating capacitor Cn 710. Qn_off is an energy recovery charge.

The floating capacitor Cn 710 of FIG. 7 will be charged/discharged during Tpre_on and Tree off, corresponding to Qn_on and Qn_off respectively. Therefore, maintaining a balance of change on the floating capacitor Cn 710 of FIG. 7 may be according to equation (3) below.

$$Q_{n\_on}+Q_{n\_off}=0 \tag{3}$$

Similarly, the floating capacitor Cp 606 of FIG. 6 will be charged/discharged during Tpre_off and Trec on, corresponding to Qp_off and Qp_on respectively. Therefore, maintaining a balance of change on the floating capacitor Cp 606 of FIG. 6 may be according to equation (4) below.

$$Q_{p\_off}+Q_{p\_on}=0 \tag{4}$$

When considering equation 3 and FIG. 7, the capacitor net-charge is zero during one pair of switching cycles (i.e. one switching on+one switching off), therefore the capacitor voltage may be maintained by designing the system and circuit accordingly. The electric charge of Qn_on and Qn_off may be derived using the relationships of equations 5 and 6 below.

$$Q_{n\_on} = \frac{1}{2} \frac{V_n T_{pre\_on}^2}{L_r} \qquad (5)$$

$$Q_{n_{off}} = -\frac{1}{2} \frac{V_n T_{rec\_off}^2}{L_r} \qquad (6)$$

In which Vn is the capacitor voltage of Cn 710. The system may be designed such that Vn is substantially constant, during each turn-on and turn-off process, when the capacitance of Cn 710 is large enough. During $T_{pre\_on}$ of turn-on process, the resonant inductor Lr 720 is charged by floating capacitor Cn 710 as electric charge flows out of $C_n$ 710 to charge resonant inductor Lr. 710. And, during $T_{rec\_off}$ of turn-off process, after the gate voltage Vg is charged to −Vn by the resonant inductor $L_r$ 720, the excessive current on $L_r$ 720 as the field collapses will flow back to $C_n$ 710 through diode D2 718 and the body diode of switch S4 708.

When designing the circuit, maintenance of the balance of $Q_{n\_on}+Q_{n\_off}=0$ to maintain the floating capacitor $C_n$ voltage is desired. In some embodiments, the value of $Q_{n\_off}$ may be slightly larger than $Q_{n\_on}$ such that a small excess of charge creates a slight increase of voltage across the floating capacitor $C_n$ 710. As indicated in above equations, $Q_{n\_on}$ is proportional to $T_{pre\_on}^2$ and $Q_{n\_off}$ is proportional to $T_{rec\_off}^2$. The adjustment of $Q_{n\_on}$ is associated with the pre-charge time $T_{pre\_on}$, and the adjustment of $Q_{n\_off}$ is associated with the pre-charge time $T_{rec\_off}$. In one embodiment, we will adjust $Q_{n\_on}$ via the pre-charge time $T_{pre\_on}$, and $Q_{n\_off}$ is associated with the pre-charge time $T_{pre\_off}$, as it may be difficult to adjust $Q_{n\_off}$ by directly adjusting the time $T_{rec\_off}$.

It is notable that the $V_{n\_ref}$ is the target voltage of floating capacitor, which could be a constant value or adjustable value if necessary.

With the proposed topology and control method of FIG. 9, the voltages $V_n/V_p$ of floating capacitors Cp 606 of FIG. 6 and Cn of FIG. 7 may be controlled at any desired value. Before the gate-drive circuit 700 of FIG. 7 is powered-on, the initial voltage Vn of the floating capacitor Cn 710 is zero, however, the floating capacitor voltage Vn may be charged up gradually after a few PWM switching cycles utilizing the control method shown in FIG. 9 such that no additional circuit or special control method is need to pre-charge this floating capacitor.

Control logic or functions performed by controller may be represented by flow charts or similar diagrams in one or more figures. These figures provide representative control strategies and/or logic that may be implemented using one or more processing strategies such as event-driven, interrupt-driven, multi-tasking, multi-threading, and the like. As such, various steps or functions illustrated may be performed in the sequence illustrated, in parallel, or in some cases omitted. Although not always explicitly illustrated, one of ordinary skill in the art will recognize that one or more of the illustrated steps or functions may be repeatedly performed depending upon the particular processing strategy being used. Similarly, the order of processing is not necessarily required to achieve the features and advantages described herein, but are provided for ease of illustration and description. The control logic may be implemented primarily in software executed by a microprocessor-based vehicle, engine, and/or powertrain controller, such as controller. Of course, the control logic may be implemented in software, hardware, or a combination of software and hardware in one or more controllers depending upon the particular application. When implemented in software, the control logic may be provided in one or more computer-readable storage devices or media having stored data representing code or instructions executed by a computer to control the vehicle or its subsystems. The computer-readable storage devices or media may include one or more of a number of known physical devices which utilize electric, magnetic, and/or optical storage to keep executable instructions and associated calibration information, operating variables, and the like.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as Read Only Memory (ROM) devices and information alterably stored on writeable storage media such as floppy disks, magnetic tapes, Compact Discs (CDs), Random Access Memory (RAM) devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:
1. A gate driver of a power device comprising:
   a supply;
   a capacitor;
   an inductor, and
   a circuit including a plurality of switching devices that are configured to (i) selectively couple the supply to a gate of the power device, (ii) selectively couple the capaci- tor to the gate and the inductor, and (iii) selectively couple the inductor to the gate, the circuit further including a controller that is configured to, during a transitional period of the power device, operate the switching devices to cause the inductor to convert a potential on the gate to a field, and the field to an opposite potential to toggle the gate and charge the capacitor to the opposite potential as an excess field collapses and, during a non-transitional period, operate the switching devices to cause the supply to maintain the gate at the potential and generate the excess field.

2. The gate driver of claim 1 wherein the controller is further configured to operate the circuit to, adjust, proportional to a voltage across the capacitor, a pre-charge time to reduce a difference between a pre-charge charge and an energy recovery charge.

3. The gate driver of claim 1, wherein the supply has a supply magnitude and the capacitor has an average magnitude over the transitional period such that the supply magnitude is greater than the average magnitude.

4. The gate driver of claim 1, wherein the supply is configured to apply a negative charge on the gate of the power device and the capacitor is configured to apply a positive charge on the gate of the power device.

5. The gate driver of claim 4 wherein the circuit further includes a body diode of a pull-up switching device and a recirculating diode that are forward biased as the excess field collapses in the inductor to flow current to recharge the capacitor.

6. The gate driver of claim 5, wherein the pull-up switching device is a metal oxide semiconductor field effect transistor (MOSFET) or a bipolar junction transistor (BJT).

7. The gate driver of claim 5 wherein the switching devices include a pull-down switching device configured to latch, to a negative potential of the supply, the negative charge.

8. The gate driver of claim 1, wherein the supply is configured to apply a positive charge on the gate of the power device and the capacitor is configured to apply a negative charge on the gate of the power device.

9. The gate driver of claim 1, wherein the power device is a Metal Oxide Semiconductor Field Effect Transistor (MOSFET) or an Insulated Gate Bipolar Junction Transistor (IGBT).

10. A method of recirculating a gate charge during transitioning of a power switch for a vehicle powertrain comprising:
by a gate driver,
latching, in an off state of the power switch, a negative charge onto a gate of a power switch by forming a conductive path from the gate through a pull-down switch and a resonant pull-down switch to a supply;
inducing, responsive to a request to turn on the power switch, a field in an inductor by flowing a negative charge on the gate of the power switch by coupling the inductor to the gate through a resonant pull-up switch and a resonant pull-up diode;
converting the field to a positive charge by opening the pull-down switch and the resonant pull-down switch;
flowing the positive charge onto the gate through the resonant pull-up diode and the resonant pull-up switch and excess charge to a capacitor through an antiparallel diode across a pull-up switch that is coupled between the capacitor and the resonant pull-up switch; and
latching the positive charge onto the gate via the capacitor by closing the pull-up switch.

11. The method of claim 10, wherein the pull-up switch and resonant pull-up switch are metal oxide semiconductor field effect transistors (MOSFETs) or bipolar junction transistors (BJTs).

12. The method of claim 10 further comprising, by a gate driver, during turn-off
inducing a field in the inductor via a positive charge that is on the gate by closing the resonant pull-down switch to pass current through a resonant pull-down diode;
converting the field to a negative charge by opening the pull-up switch and the resonant pull-up switch;
flowing the negative charge onto the gate through the resonant pull-down diode and the resonant pull-down switch and creating an excess field by a supply; and
latching the negative charge onto the gate by the supply by closing the pull-down switch.

13. A gate driver of a power device comprising:
a capacitor and a supply arranged with a first set of switching devices in a circuit in a push-pull configuration;
a resonant circuit, including an inductor that is selectively couplable to the gate in a pull-up and a pull-down mode by a second set of switching devices and corresponding diodes; and
a controller configured to operate the first set and the second set of switching devices to recirculate charge during turn-off by inducing a first field based on a positive charge from a gate of the power device caused by a positive potential of the supply, and in response to reversal of a voltage across the inductor, collapsing the first field to draw charge from the gate and to a capacitor.

14. The gate driver of claim 13 wherein the controller is further configured to, adjust, proportional to a voltage across the capacitor, a pre-charge time to reduce a difference between a pre-charge charge and an energy recovery charge.

15. The gate driver of claim 13, wherein the supply has a supply magnitude and the capacitor has an average magnitude over the turn-off such that the supply magnitude is greater than the average magnitude.

16. The gate driver of claim 13, wherein the resonant circuit includes a low-side switch configured to latch the gate to a negative potential of the capacitor.

17. The gate driver of claim 16, wherein the controller is further configured operate the first set and the second set to recirculate charge during turn-on by inducing a second field based on a negative charge from a gate caused by the negative potential, and in response to reversal of the voltage across the inductor, collapsing the second field to inject charge onto the gate.

* * * * *